United States Patent [19]
Sahlman

[11] Patent Number: 6,002,923
[45] Date of Patent: Dec. 14, 1999

[54] SIGNAL GENERATION IN A COMMUNICATIONS TRANSMITTER

[75] Inventor: Karl-Gösta Sahlman, Älvsjö, Sweden

[73] Assignee: Telefonaktiebolaget LM Ericsson, Stockholm, Sweden

[21] Appl. No.: 08/966,240

[22] Filed: Nov. 7, 1997

[51] Int. Cl.⁶ ...................................................... H04B 1/38
[52] U.S. Cl. .......................................... 455/118; 332/145
[58] Field of Search .............................. 455/91, 108, 109, 455/110, 112, 113, 118, 204, 205; 375/298, 300; 370/487, 490, 493, 494, 495, 527, 529; 332/103, 145

[56] References Cited

U.S. PATENT DOCUMENTS

| | | | |
|---|---|---|---|
| 5,128,623 | 7/1992 | Gilmore | 328/14 |
| 5,309,479 | 5/1994 | Cheah | 375/62 |
| 5,329,260 | 7/1994 | Poplin | 332/119 |
| 5,374,903 | 12/1994 | Blanton | 331/4 |
| 5,430,416 | 7/1995 | Black et al. | 332/145 |
| 5,463,357 | 10/1995 | Hobden | 332/151 |
| 5,519,732 | 5/1996 | Chester | 375/295 |
| 5,521,946 | 5/1996 | Main | 375/350 |
| 5,649,297 | 7/1997 | Park | 455/45 |
| 5,668,505 | 9/1997 | Vu et al. | 331/49 |
| 5,757,854 | 5/1998 | Hunsinger et al. | 375/260 |
| 5,796,783 | 8/1998 | Crawford | 375/298 |

FOREIGN PATENT DOCUMENTS

| | | |
|---|---|---|
| 0 551 573 A2 | 7/1993 | European Pat. Off. . |
| WO 96/42160 | 12/1996 | WIPO . |

OTHER PUBLICATIONS

L.O. Eber, et al., "Digital Generation of Wideband LFM Waveforms," *International Radar Conference* (Apr. 1975): 170–175.

B.V. Kameke, "Synchronisierte Mikrowelenoszillator als Leistungverstärker und Frequenzteiler in Brietband–Richtfunksystemen," 70 (Apr. 1980): 243–249.

Primary Examiner—Wellington Chin
Assistant Examiner—Dablo N. Tran
Attorney, Agent, or Firm—Jenkins & Gilchrist P.C.

[57] ABSTRACT

A transmitter subsystem is disclosed whereby the output frequency spectrum of a DDS device, for use in the transmitter subsystem, is frequency multiplied to achieve greater frequency coverage at the RF bands. In one embodiment of the present invention, a DDS device is structured in such a way that the DDS output signal spectra can be multiplied directly for direct conversion to RF or IF bands. As such, the requirements placed on the DACs in the DDS device are lessened, because the DACs require much lower sampling frequencies than those used in the existing technology. Also, the requirements placed on the implemented bandpass filters used for image rejection in the applied upconverters are lessened, because of the larger frequency difference created between the desired output and the image frequency band. In a second embodiment of the present invention, a DDS device is also structured in such a way that multiplication of the baseband spectra can be accomplished at the IF. Consequently, in accordance with the present invention, less complex or costly DACs can be used for generating wideband signals at higher frequencies, but relatively high linearity signals can still be attained.

23 Claims, 3 Drawing Sheets

SIGNAL GENERATION IN A COMMUNICATIONS TRANSMITTER

BACKGROUND OF THE INVENTION

1. Technical Field of the Invention

The present invention relates generally to the radio transmitter field and, in particular, to a method and system for upconverting Direct Digital Synthesis (DDS) signals to a radio frequency (RF) band.

2. Description of Related Art

One aim in developing new radio transmitters is to make them smaller and cheaper to produce, while providing at least the same or better performance than prior transmitters. One way to achieve this goal is to move the digital domain closer to the transmitter's output and thereby eliminate a number of analog components. Transmitters that employ DDS to generate signals have been developed to achieve this goal.

Today's DDS technology has begun to mature and is now commonly used for generating communications signals. For example, DDS-driven Phase Locked Loops (PLLs) are being used in the process of upconverting Intermediate Frequency (IF) signals to the RF transmit band. Also, DDS baseband signals are being directly converted to signals in the RF transmit band. The primary advantage of using DDS-driven upconversion processes is that frequency adjustments can be made instantaneously, which is especially advantageous for multi-carrier transmitter applications. In DDS-driven PLL applications, the frequency adjustment rates are limited by the PLLs' response times. Consequently, frequency adjustments for the DDS-driven PLL upconversion approaches being used are not as instantaneous as the DDS direct upconversion approaches being used.

DDS technology can be used for just about any type of conventional modulation or access technique, such as, for example, amplitude modulation (AM), phase angle modulation (PM), Code Division Multiple Access (CDMA), etc. However, a drawback of the existing DDS technology is that the currently available digital-to-analog converter (DAC) clock frequencies limit DDS applications to the utilization of very small parts of the RF bands. In order to realize fairly good image filtering, the ratio of the IF band, $df_{IF}$, to the mean IF, $f_{IF}$, selected should be very low. Consequently, the DDS frequency generator used should have a very high clock frequency in order to be able to utilize it for the higher frequencies. As such, if a conventional DDS frequency generator is used to generate frequencies which are higher than up to 33% of the DDS clock frequency, signal generation problems are encountered due to the aliasing bands that are folded in from multiples of the DDS clock frequency, $f_{clock}$. Furthermore, the use of conventional DACs for converting DDS signals produces relatively low signal-to-noise ratios (SNRs), Spurious Free Dynamic Ranges (SFDRs), and Effective Number of Bits (ENOBS) at the higher sampling rates, because the conventional DACs lose sufficient linearity at high sampling rates. However, as described below, the present invention successfully solves these problems.

SUMMARY OF THE INVENTION

The output frequency spectrum of a DDS device, for use in a transmitter system, is frequency multiplied to achieve greater frequency coverage at the RF bands. In one embodiment of the present invention, a DDS device is structured in such a way that the DDS output signal spectra can be multiplied directly for direct conversion to RF or IF bands. As such, the technical requirements placed on the DACs in the DDS device are lessened, because the DACs require much lower sampling frequencies than those used in the existing DDS technology. Also, the technical requirements placed on the implemented bandpass filters used for image rejection in the applied upconverters are lessened, because of the larger frequency difference created between the desired output and the image frequency band. In a second embodiment of the present invention, a DDS device is also structured in such a way that multiplication of the baseband spectra can be accomplished at the IF. Consequently, in accordance with the present invention, less complex or costly DACs can be used for generating wideband signals at higher frequencies, but relatively high linearity signals can still be attained.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

The preferred embodiment of the present invention and its advantages are best understood by referring to FIGS. 1–6 of the drawings, like numerals being used for like and corresponding parts of the various drawings.

Essentially, the output frequency spectrum of a DDS device, for use in a transmitter system, is frequency multiplied to achieve greater frequency coverage at the RF bands. In one embodiment of the present invention, a DDS device is structured in such a way that the DDS output signal spectra can be multiplied to achieve higher baseband frequency. As such, the requirements placed on the DACs in the DDS device are lessened, because the DACs require much lower sampling frequencies than those used in the existing DDS technology. Also, the requirements placed on the implemented bandpass filters used for image rejection (e.g., BPF 214 in FIG. 5) in the applied upconverters are lessened, because of the larger frequency difference created between the desired output and the image frequency band. In a second embodiment of the present invention, a DDS device is also structured in such a way that multiplication of the baseband spectra can be accomplished at the IF. Consequently, in accordance with the present invention, less complex or costly DACs can be used for generating baseband signals at higher frequencies, but relatively high linearity signals can still be attained.

Figure 1A:
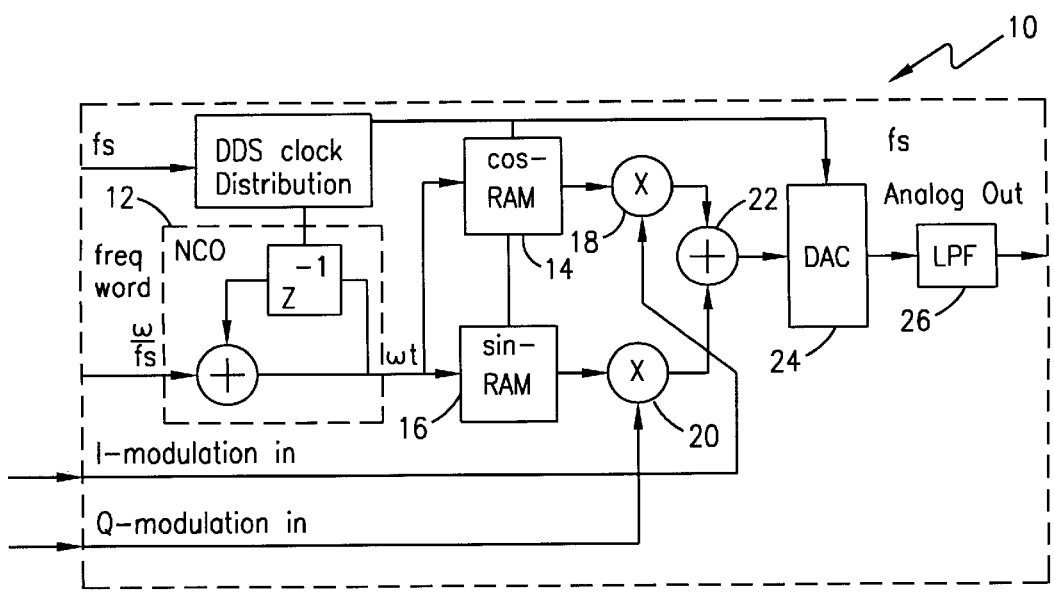
FIGS. 1A, 1B and 1C are related prior art diagrams that illustrate the basic problem that arises when the existing DDS technology is implemented to generate baseband signals.
Figure 1B:
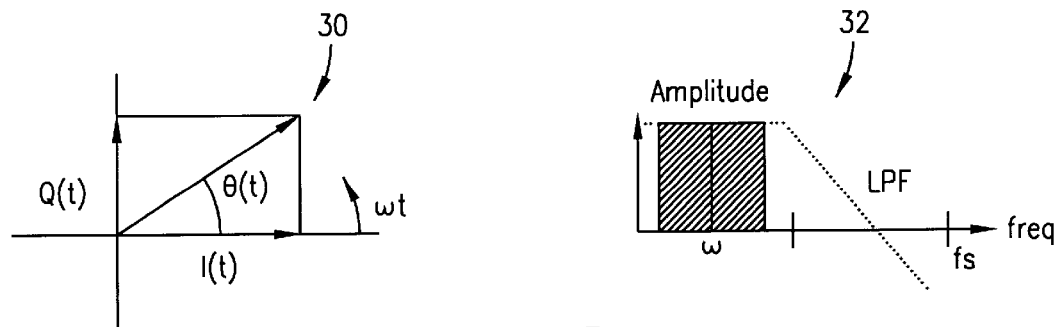
Figure 1C:
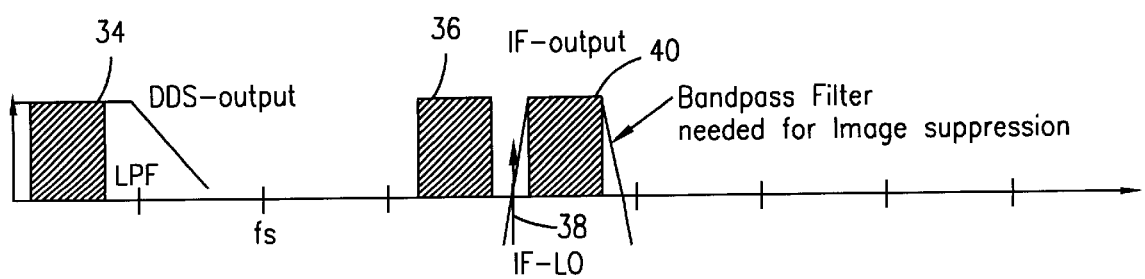

FIGS. 1A, 1B and 1C are related prior art diagrams that illustrate the basic problem that arises when existing DDS technology is implemented to generate baseband signals for IF and RF conversion. Specifically, FIG. 1A shows a known DDS device 10 implemented for I- and Q-modulation of the output signal from the numerically-controlled oscillator (NCO) 12. The output from the NCO 12 is used for direct baseband signal generation with the I- and Q-modulation. Under the control of an input frequency word, the angular (ωt) output signal from the NCO 12 is coupled to a respective address input of a cosine-random access memory (RAM) device 14 and sine-RAM device 16. The contents of those addressed locations in RAMS 14 and 16 are multiplied (18, 20) with the respective I- and Q-modulation signals. The modulated signals are added (22) and the resultant is converted to an analog signal by DAC 24. The analog baseband signal is then lowpass filtered and output from the DDS device 10. FIG. 1B shows the spectral outline of the output signal (32) from the DDS device 10 for the I- and Q-modulation input signals (30) shown. FIG. 1C shows the spectral output of the baseband signal 34 from the DDS device 10, and the IF signal 40 converted from the baseband signal from DDS device 10. As shown, the desired IF signal 40 and the unwanted image signal 36 are generated when the baseband signal is mixed with the local oscillator signal 38. A bandpass filter passes the desired IF signal and suppresses the image signal. FIG. 1C illustrates that a high demand is placed on the image filtering capability for a very wide baseband frequency range. Also, although not illustrated explicitly by FIG. 1C, a high sampling frequency, $f_s$, is required for the DAC 24, which is a limitation imposed by the existing DAC technology.

Figure 2:
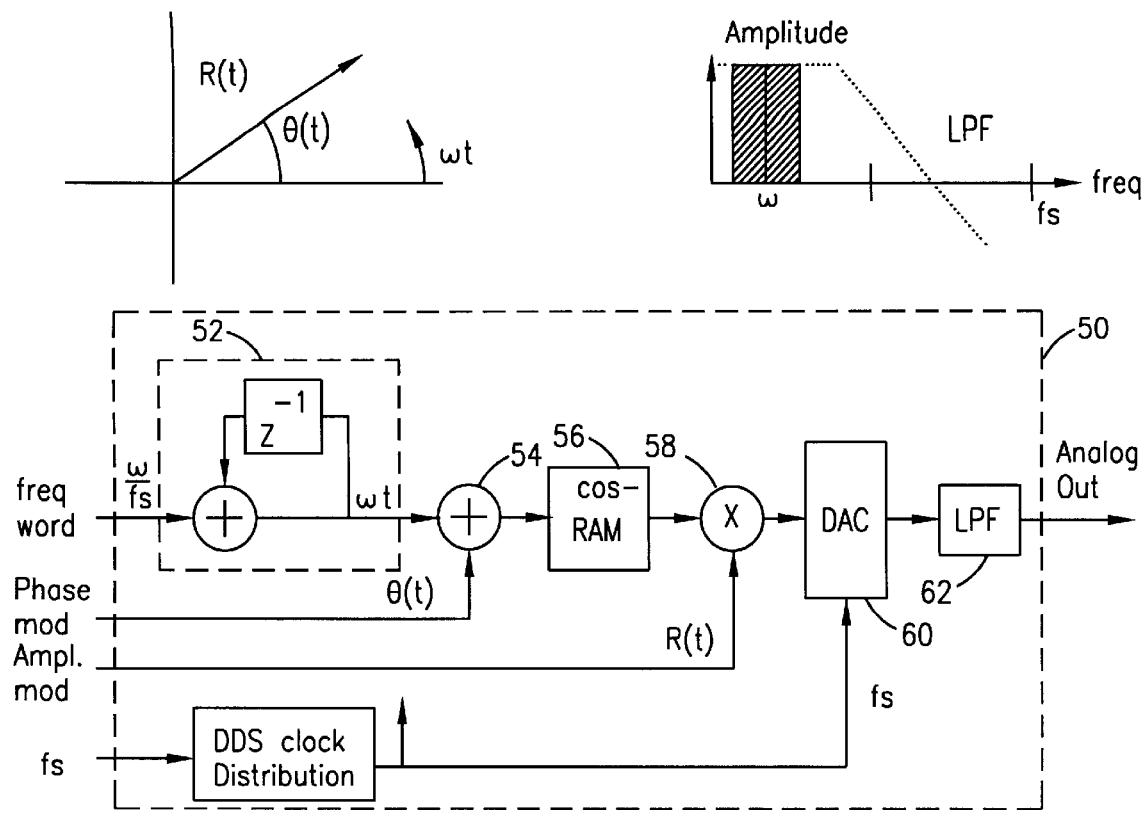
FIG. 2 is a block diagram of a prior art DDS device implemented for amplitude and phase (polar) modulation of the NCO output signal.

FIG. 2 is a block diagram of a prior art DDS device 50 implemented for amplitude and phase (polar) modulation of the NCO 52 output signal. Under the control of the input frequency word, the angular (ωt) output signal from the NCO 52 is added (54) to the phase modulation input signal. The resultant is coupled to the address input of a cosine-RAM device 56. The contents of the addressed memory location in cosine-RAM 56 are output and multiplied with the amplitude modulation input signal. The resulting digital amplitude-and phase-modulated signal is converted to an analog signal by DAC 60, lowpass filtered (62), and output from the DDS device 50. As shown, the resulting output signal comprises a multiplication 58 of two spectra: one for the amplitude signal; and a second for the phase signal. The amplitude signal vector, R(t), covers the baseband from 0 Hz and up. The phase modulation signal is a Constant Amplitude Phase Modulation (CPM) signal, which is a bandpass signal within the baseband of the DAC 60.

In operation, with I- and -Q-modulation, the amplitude-modulated input signal can be expressed as:

$$R(t)=\sqrt{I(t)^2+Q(t)^2}, \qquad (1)$$

where $0 \leq R(t) \leq 1$. The phase-modulated input signal can be expressed as:

$$\theta(t) = \arctan\left(\frac{Q(t)}{I(t)}\right), \qquad (2)$$

where the phase angle is between ±π. The analog output signal, V(t), from the DDS device 50 can be expressed as:

$$V(t)=R(t) \cos (\omega t+\theta(t)). \qquad (3)$$

Figure 3:
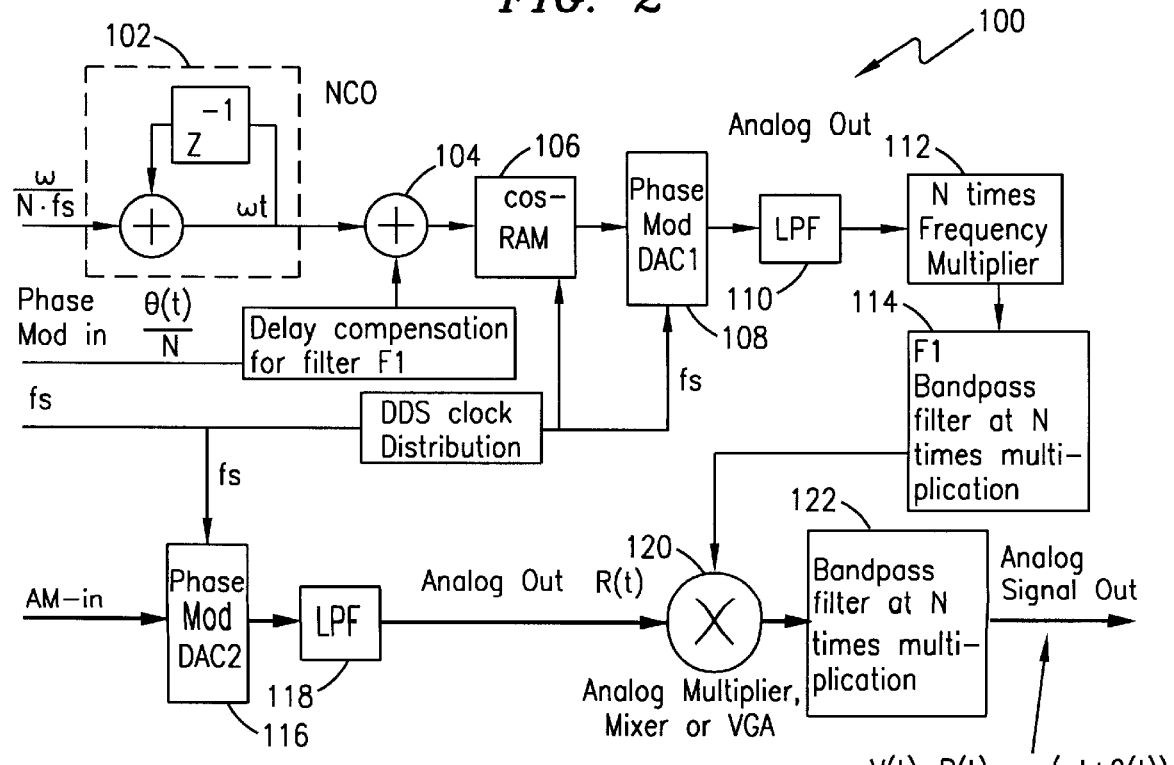
FIG. 3 is a block diagram of a transmitter subsystem including DDS with baseband multiplication, which is structured in accordance with a preferred embodiment of the present invention.

FIG. 3 is a block diagram of a transmitter subsystem 100 including DDS with baseband multiplication, which is structured in accordance with a preferred embodiment of the present invention. Under the control of an input frequency word, the angular (ωt) signal output from the NCO 102 is added (104) to the delay compensated phase-modulation input signal. The resultant signal is coupled to the address input of a cosine-RAM device 106. The contents of the addressed memory location are converted to an analog signal by a first (phase modulation) DAC 108. The phase-modulated analog output signal is lowpass filtered (110), and frequency multiplied by frequency multiplier 112. As described below for this exemplary embodiment, the frequency multiplication factor, N, is three. The frequency multiplied signal is then bandpass filtered (114).

An amplitude-modulation input signal is converted to an analog signal by a second DAC 116. The analog amplitude-modulation signal is lowpass filtered (118), and multiplied (120) with the frequency multiplied, phase-modulated analog signal from bandpass filter 114. The resulting signal is bandpass filtered (122) and output from the subsystem 100.

In order to attain the correct timing at the frequency multiplier 112, the CPM (phase-modulated) input signal is time advanced to compensate for the delay introduced by the applied bandpass filter 114 after multiplication of the constant amplitude spectrum output from DAC 108. As such, the digital signal processor (DSP) part of the DDS device preferably includes a time advance function. Also, if the applied bandpass filter 114 is a narrowband filter, an equalizer functioning digital filter is preferably used.

Figure 4A:
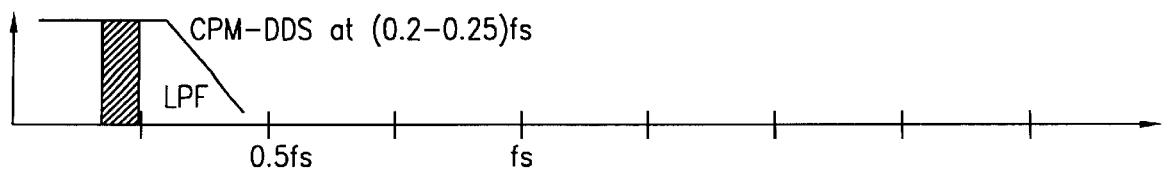
FIGS. 4A, 4B, and 4C are related graphical diagrams that illustrate the different signal spectra in the DDS device shown in FIG. 3.
Figure 4B:
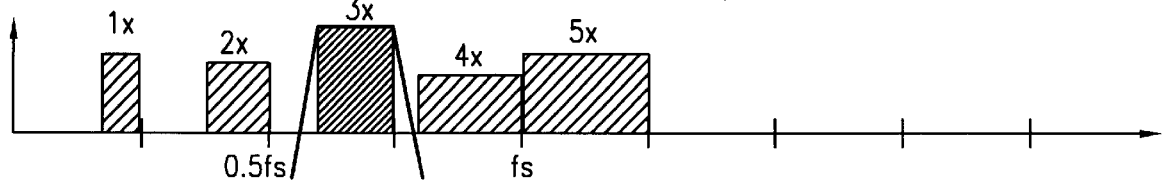
Figure 4C:
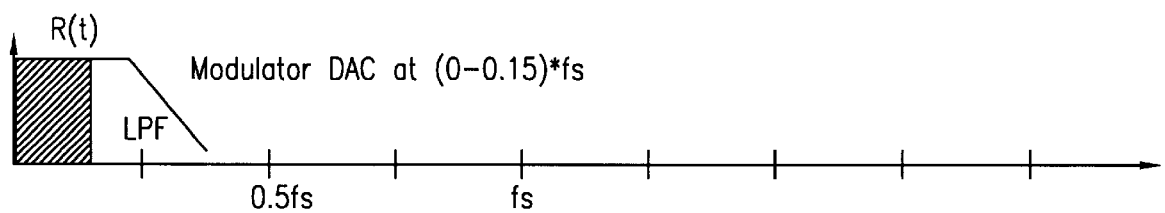

FIGS. 4A, 4B, and 4C are related graphical diagrams that illustrate the different signal spectra in the DDS device shown in FIG. 3. As mentioned above for this embodiment, the multiplication factor, N, is three. FIG. 4A shows the CPM-DDS analog output signal spectra from lowpass filter 110. FIG. 49 shows the frequency multiplied signal spectra for N=2 through 5, and the output signal spectra from the bandpass filter 114 (selectively filtered at 3 times the baseband frequency). FIG. 4C shows the amplitude-modulated analog output signal from lowpass filter 118. The frequency multiplier 112 in FIG. 3 is preferably arranged in a balanced configuration, which suppresses the even harmonics at the output of the device. This balanced configuration reduces the technical requirements imposed on the bandpass filter used. For the exemplary (N=3) embodiment, the second DAC 116 provides amplitude-modulation in the range <0.15 $f_s$, and the first DAC 108 provides phase-modulation in the (0.2–0.25) *$f_s$ wide baseband range. The highest modulation frequency used in DAC 108 is preferably 0.25 $f_s$. The output modulation band is preferably (0.6–0.75)*fs by using analog multiplication instead of the digital approach used in the prior art devices shown in FIGS. 1 and 2.

Notably, in contrast with the present invention, the DDS implementation shown in FIG. 1 will, for the same output spectrum (with the highest frequency corresponding to 0.3 $f_s$), require a 0.75/0.3=2.5 times higher sampling rate, $f_s$, for the DAC used. Consequently, in accordance with the present invention, the power dissipation in the DACs and DSP parts of the DDS device in FIG. 3 is reduced, because the clock speeds in FIG. 3 are much lower than those used in FIGS. 1 and 2. Also in accordance with the present invention, the frequency multiplication approach used significantly reduces the signal-to-noise ratio (SNR) in comparison with the SNRs for the prior art devices. Moreover, because the DACs 108 and 116 used are operating at substantially lower sampling rates, the achievable ENOBs for these DACs is much higher than in a DAC operating at a 2.5 times higher sampling rate.

Figure 5:
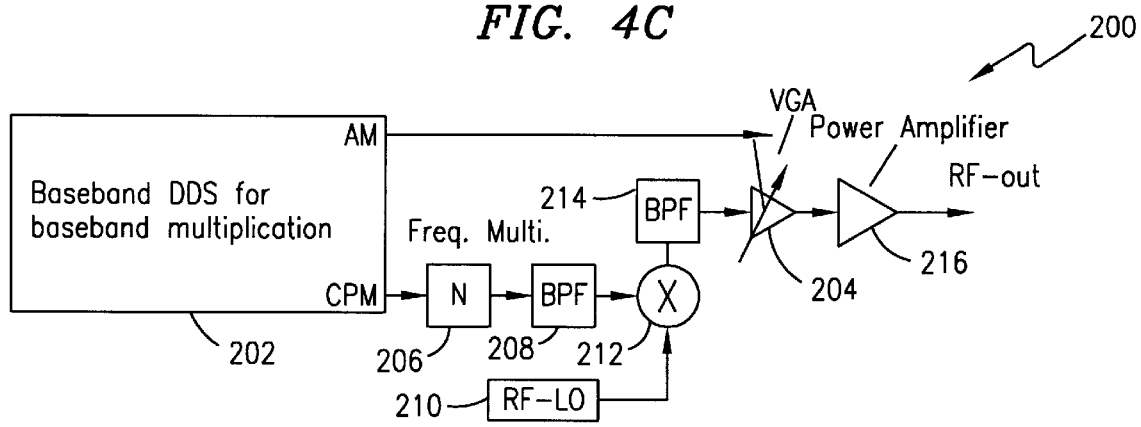
FIG. 5 is a block diagram of an exemplary transmitter subsystem that can be used to directly upconvert a DDS signal to an RF signal for transmission using frequency multiplication, in accordance with a preferred embodiment of the present invention.

FIG. 5 is a block diagram of an exemplary transmitter subsystem 200 that can be used to directly upconvert a DDS signal to an RF signal for transmission using frequency multiplication, in accordance with the preferred embodiment of the present invention. Essentially, the amplitude-modulated analog output signal from DDS baseband signal generator 202 is coupled to a first input of a variable gain amplifier (VGA) 204. The phase-modulated (CPM) analog output signal from the DDS baseband signal generator 202 is frequency multiplied (206) by N times the baseband frequency. The frequency multiplied signal is bandpass filtered (208) to pass the frequency multiplied (N) spectra. The frequency multiplied output signal from the bandpass filter 208 is multiplied with an RF local oscillator signal (210) by mixer 212. The resulting RF signal from mixer 212 is bandpass filtered (214) preferably to select the upper sideband spectra for transmission. The bandpass filtered signal is coupled to a second input of the VGA 204, and mixed with the amplitude-modulated signal at the first input of the VGA. The resulting RF signal is power amplified (216) and coupled to the transmitter subsystem's final output stage. Notably, in a different aspect of this embodiment, a DDS-driven PLL can be used if instantaneous frequency changes are not required.

Figure 6:
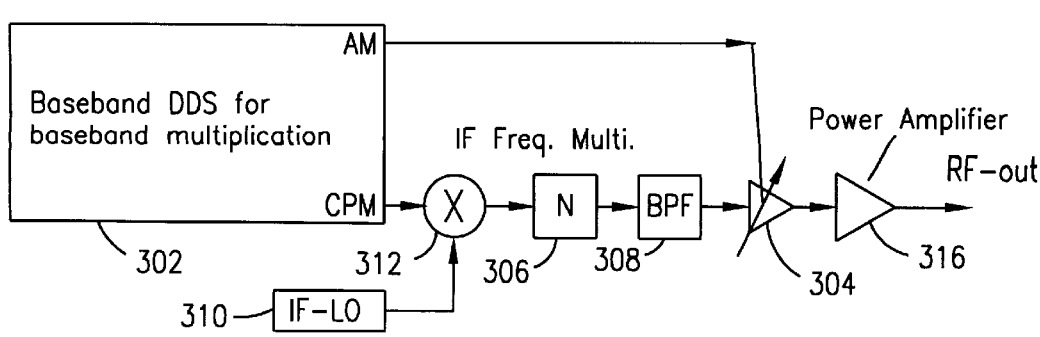
FIG. 6 is a block diagram of an exemplary transmitter subsystem that can be used to convert a DDS signal to an RF signal using IF band multiplication, in accordance with a second embodiment of the present invention.

FIG. 6 is a block diagram of an exemplary transmitter subsystem 300 that can be used to convert a DDS signal to an RF signal using IF band multiplication, in accordance with a second embodiment of the present invention. Essentially, the amplitude-modulated analog output signal from DDS baseband signal generator 302 is coupled to a first input of a VGA 304. The phase-modulated (CPM) analog output signal from the DDS baseband signal generator 302 is mixed (312) with a signal from IF local oscillator 310. The resulting IF signal is frequency multiplied (306) up to an RF signal. The frequency multiplied (RF) signal is bandpass filtered (308) to pass the desired frequency multiplied (RF) spectra. The frequency multiplied output signal from the bandpass filter 308 is coupled to a second input of VGA 304, and mixed with the amplitude-modulated signal at the first input of the VGA. The resulting RF signal is power amplified (316) and coupled to the final output stage of the transmitter subsystem.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A system for generating an RF signal in a communications transmitter, comprising:
    a DDS signal generator for generating a baseband signal, said baseband signal comprising an amplitude-modulated signal and a phase-modulated signal;
    a frequency multiplier coupled to a first output of said DDS signal generator for multiplying said phase-modulated signal;
    a frequency upconverter, coupled to said frequency multiplier, for upconverting an output of said frequency multiplier; and
    a combiner, coupled to said frequency upconverter and a second output of said DDS signal generator, for combining an output of said frequency upconverter with said amplitude-modulated signal.

2. The system of claim 1, wherein said DDS signal generator comprises a DDS channel signal generator.

3. The system of claim 1, wherein said combiner comprises a variable gain amplifier.

4. The system of claim 1, wherein said frequency multiplier comprises a DDS-driven continuous amplitude phase-modulated phase lock loop.

5. The system of claim 1, wherein said DDS signal generator includes at least one digital to analog converter coupled to an output of a digital signal generator.

6. The system of claim 1, wherein said frequency upconverter comprises:
    a first bandpass filter coupled to an output of said frequency multiplier;
    an RF mixer coupled to an output of said bandpass filter and an output of an RF local oscillator; and
    a second bandpass filter coupled to an output of said RF mixer.

7. A system for generating an RF signal in a communications transmitter, comprising:
    a DDS signal generator for generating a baseband signal, said baseband signal comprising an amplitude-modulated signal and a phase-modulated signal;
    a frequency upconverter, coupled to a first output of said DDS signal generator, for upconverting said phase-modulated signal to an IF signal;
    a frequency multiplier, coupled to said frequency upconverter, for further upconverting said IF signal; and
    a combiner, coupled to said frequency multiplier and a second output of said DDS signal generator, for combining an output of said frequency multiplier with said amplitude-modulated signal.

8. The system of claim 7, wherein said DDS signal generator comprises a DDS channel signal generator.

9. The system of claim 7, wherein said frequency multiplier comprises a DDS-driven continuous amplitude phase modulated phase lock loop.

10. The system of claim 7, wherein said DDS signal generator includes at least one digital to analog converter coupled to an output of a digital signal generator.

11. The system of claim 7, wherein said combiner comprises a variable gain amplifier.

12. An improved baseband signal generator for use in a communications transmitter, comprising:
    a DDS signal generator for generating a baseband signal, said baseband signal comprising a phase-modulated signal and an amplitude-modulated signal;
    a frequency multiplier coupled to said DDS signal generator, for multiplying said phase-modulated signal; and
    an analog multiplier coupled to said frequency multiplier and an amplitude-modulated output of said DDS signal generator, for multiplying an output of said frequency multiplier with said amplitude-modulated output signal.

13. The improved baseband signal generator of claim 12, wherein said DDS signal generator comprises a DDS channel signal generator.

14. The improved baseband signal generator of claim 12, wherein said frequency multiplier comprises a DDS-driven continuous amplitude phase-modulated phase lock loop.

15. A method for generating an RF signal in a communications transmitter, comprising the steps of:

generating a baseband signal, said baseband signal comprising an amplitude-modulated signal and a phase-modulated signal;

frequency multiplying said phase modulated signal;

upconverting a multiplication of said phase-modulated signal to obtain an intermediate RF signal; and combining said intermediate RF signal with said amplitude-modulated signal.

16. The method of claim 15, wherein said combining step is performed by a variable gain amplifier.

17. The method of claim 15, wherein the frequency multiplying step further comprises bandpass filtering said multiplication of said phase-modulated signal.

18. A method for generating an RF signal in a communications transmitter, comprising the steps of:

generating a baseband signal, said baseband signal comprising an amplitude-modulated signal and a phase-modulated signal;

upconverting said phase-modulated signal to generate an IF signal;

frequency multiplying said IF signal to obtain an intermediate RF signal; and combining said intermediate RF signal with said amplitude-modulated signal.

19. The method of claim 18, wherein said combining step is performed by a variable gain amplifier.

20. The method of claim 18, wherein the frequency multiplying step further comprises bandpass filtering said intermediate RF signal.

21. A method for generating a baseband signal with frequency multiplication, comprising the steps of:

generating said baseband signal, said baseband signal comprising a phase-modulated signal and an amplitude-modulated signal;

frequency multiplying said phase-modulated signal; and performing an analog multiplication of a frequency multiplication of said phase-modulated signal with said amplitude-modulated signal.

22. The method of claim 21, wherein said performing step is performed by a variable gain amplifier.

23. The method of claim 21, wherein the frequency multiplying step further comprises bandpass filtering said multiplication of said phase-modulated signal.

* * * * *

UNITED STATES PATENT AND TRADEMARK OFFICE
CERTIFICATE OF CORRECTION

PATENT NO. : 6,002,923
DATED : Dec. 14, 1999
INVENTOR(S) : Karl-Gösta Sahlman

It is certified that error appears in the above-identified patent and that said Letters Patent is hereby corrected as shown below:

Column 4, line 45      Replace "FIG. 49"
                       With --FIG. 4B--

[73] Assignee:         After "Ericsson"
                       Insert --(publ)--

Attorney, Agent, or Firm
                       Replace "Jenkins"
                       With --Jenkens--

Signed and Sealed this

Twenty-second Day of May, 2001

Attest:

NICHOLAS P. GODICI

Attesting Officer    Acting Director of the United States Patent and Trademark Office